(12) United States Patent
Tepman

(10) Patent No.: US 7,513,982 B2
(45) Date of Patent: Apr. 7, 2009

(54) TWO DIMENSIONAL MAGNETRON SCANNING FOR FLAT PANEL SPUTTERING

(75) Inventor: Avi Tepman, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 863 days.

(21) Appl. No.: 10/863,152

(22) Filed: Jun. 7, 2004

(65) Prior Publication Data

US 2005/0145478 A1   Jul. 7, 2005

Related U.S. Application Data

(60) Provisional application No. 60/534,952, filed on Jan. 7, 2004.

(51) Int. Cl.
*C23C 14/00* (2006.01)
*C23C 14/34* (2006.01)
*C23C 14/32* (2006.01)
*C25B 9/00* (2006.01)
*C25B 11/00* (2006.01)
*C25B 13/00* (2006.01)

(52) U.S. Cl. ............... 204/298.2; 204/298.01; 204/298.09; 204/298.16; 204/298.19; 204/298.22; 204/192.1

(58) Field of Classification Search ............ 156/345.46; 204/192.12, 192.15, 298.06, 298.09, 298.2, 204/298.22, 298.29
See application file for complete search history.

(56) References Cited

U.S. PATENT DOCUMENTS 3,878,085 A   4/1975   Corbant ............... 204/298
4,312,731 A * 1/1982   Morrison, Jr. .......... 204/192.12
4,426,275 A * 1/1984   Meckel et al. .......... 204/298.06
4,437,966 A   3/1984   Hope et al. ............. 204/298
4,444,643 A   4/1984   Garrett ................ 204/298.2
4,600,492 A   7/1986   Ooshio et al. ........... 204/298.2

(Continued)

FOREIGN PATENT DOCUMENTS

DE   2707144   2/1977

(Continued)

OTHER PUBLICATIONS

Sloan, Domestic Price List, Jul. 1, 1981, 1-68 pp.

(Continued)

*Primary Examiner*—Alexa D Neckel
*Assistant Examiner*—Michael Band
(74) *Attorney, Agent, or Firm*—Charles S. Guenzer; Patterson & Sheridan LLP

(57) ABSTRACT

A generally rectangular magnetron placed at the back of a rectangular target to intensify the plasma in a sputter reactor configured for sputtering target material onto a rectangular panel. The magnetron has a size only somewhat less than that of the target and is scanned in the two perpendicular directions of the target with a scan length of, for example, about 100 mm for a 2 m target. The scan may follow a double-Z pattern along two links parallel to a target side and the two connecting diagonals. The magnetron includes a closed plasma loop formed in a convolute shape, for example, serpentine or rectangularized helix with an inner pole of nearly constant width extending along a single path and having one magnetic polarity completely surrounded by an outer pole having the opposed polarity.

30 Claims, 11 Drawing Sheets

U.S. PATENT DOCUMENTS

| | | | |
|---|---|---|---|
| 4,631,106 A | 12/1986 | Nakazato et al. | 156/345 |
| 4,714,536 A | 12/1987 | Freeman et al. | 204/298.2 |
| 4,826,584 A | 5/1989 | dos Santos Pereiro Ribeiro | 204/298.09 |
| 5,242,566 A | 9/1993 | Parker | 204/298.2 |
| 5,252,194 A | 10/1993 | Demaray et al. | 204/298.2 |
| 5,262,028 A * | 11/1993 | Manley | 204/192.12 |
| 5,262,030 A | 11/1993 | Potter | |
| 5,314,597 A | 5/1994 | Harra | 204/192.13 |
| 5,320,728 A | 6/1994 | Tepman | 204/192.12 |
| 5,328,585 A * | 7/1994 | Stevenson et al. | 204/298.2 |
| 5,374,343 A | 12/1994 | Sasaki et al. | 204/298.2 |
| 5,382,344 A | 1/1995 | Hosokawa et al. | 204/298.2 |
| 5,458,759 A | 10/1995 | Hosokawa et al. | 204/298.2 |
| 5,833,815 A | 11/1998 | Kim et al. | 204/192.12 |
| 5,855,744 A | 1/1999 | Halsey et al. | 204/192.12 |
| 5,873,989 A | 2/1999 | Hughes et al. | 204/298.2 |
| 5,876,574 A | 3/1999 | Hofmann et al. | 204/192.13 |
| 6,183,614 B1 | 2/2001 | Fu | 204/298.2 |
| 6,284,106 B1 * | 9/2001 | Haag et al. | 204/192.12 |
| 6,322,679 B1 | 11/2001 | DeBosscher et al. | 204/298.2 |
| 6,416,639 B1 | 7/2002 | DeBosscher et al. | 204/298.2 |
| 6,436,252 B1 * | 8/2002 | Tzatzov et al. | 204/298.22 |
| 6,461,485 B2 * | 10/2002 | Mizouchi et al. | 204/192.15 |
| 6,723,210 B2 | 4/2004 | Teng et al. | 204/192.15 |
| 2003/0234175 A1 | 12/2003 | Teng | 204/192.12 |

FOREIGN PATENT DOCUMENTS

| | | |
|---|---|---|
| DE | 197 01 575 | 7/1998 |
| EP | 0 858 095 | 6/1998 |
| JP | 53-7286 | 1/1978 |
| JP | 58016078 A * | 1/1983 |

OTHER PUBLICATIONS

International Search Report and Written Opinion for International Application No. PCT/US06/28178 dated Jun. 23, 2008.

\* cited by examiner

TWO DIMENSIONAL MAGNETRON SCANNING FOR FLAT PANEL SPUTTERING

RELATED APPLICATION

This application claims benefit of provisional application 60/534,952, filed Jan. 7, 2004.

FIELD OF THE INVENTION

The invention relates generally to sputtering of materials. In particular, the invention relates to scanning of the magnetron creating a magnetic field to enhance sputtering from rectangular targets.

BACKGROUND ART

Over the past decade, the technology has been intensively developed for fabricating flat panel displays, such as used for computer displays and more recently for television screens. Sputtering is the preferred approach in fabricating flat panels for depositing conductive layers including metals such as aluminum and transparent conductors such as indium tin oxide (ITO). Flat panel sputtering is principally distinguished from the long developed technology of wafer sputtering by the large size of the substrates and their rectangular shape. Demaray et al. describe such a flat panel sputter reactor in U.S. Pat. No. 5,565,071, incorporated herein by reference in its entirety. Their reactor includes, as illustrated in the schematic cross section of FIG. 1, a rectangularly shaped sputtering pedestal electrode 12 for holding a rectangular glass panel 14 or other substrate in stationary opposition to a rectangular sputtering target 16 within a vacuum chamber 18. The target 16, at least the surface of which is composed of a metal to be sputtered, is vacuum sealed to the vacuum chamber 18 across an isolator 20. Typically, a layer of the material to be sputtered is bonded to a backing plate in which cooling water channels are formed to cool the target 16. A sputtering gas, typically argon, is supplied into the vacuum chamber 18 held at a pressure in the milliTorr range. Advantageously, a back chamber 22 is vacuum sealed to the back of the target 16 and vacuum pumped to a low pressure, thereby substantially eliminating the pressure differential across the target 16 and its backing plate. Thereby, the target assembly can be made much thinner. When a negative DC bias is applied to the conductive target 16 with respect to the pedestal electrode 12 or other grounded parts of the chamber such as wall shields, the argon is ionized into a plasma. The positive argon ions are attracted to the target 16 and sputter metal atoms from it. The metal atoms are partially directed to the panel 14 and deposit thereon a layer at least partially composed of the target metal. Metal oxide or nitride may be deposited in a process called reactive sputtering by additionally supplying oxygen or nitrogen into the chamber 18 during sputtering of the metal.

To increase the sputtering rate, a linear magnetron 24, also illustrated in schematic bottom view in FIG. 2, is placed in back of the target 16. It has a central pole 26 of one vertical magnetic polarity surrounded by an outer pole 28 of the opposite polarity to project a magnetic field within the chamber 18 and parallel to the front face of the target 16. The two poles 26, 28 are separated by a substantially constant gap 30 over which a high-density plasma is formed under the correct chamber conditions and flows in a close loop or track. The outer pole 28 consists of two straight portions 32 connected by two semi-circular arc portions 34. The magnetic field traps electrons and thereby increases the density of the plasma and as a result increases the sputtering rate. The relatively small widths of the linear magnetron 24 and of the gap 30 produces a higher magnetic flux density. The closed shape of the magnetic field distribution along a single closed track forms a plasma loop generally following the gap 30 and prevents the plasma from leaking out the ends. However, the small size of the magnetron 24 relative to the target 16 requires that the magnetron 24 be linearly and reciprocally scanned across the back of the target 16. Typically, a lead screw mechanism drives the linear scan, as disclosed by Halsey et al. in U.S. Pat. No. 5,855,744 in the context of a more complicated magnetron. Although horseshoe magnets may be used, the preferred structure includes a large number of strong cylindrical magnets, for example, of NdBFe arranged in the indicated pole shapes with their orientations inverted between the two indicated polarities. Magnetic pole pieces may cover the operating faces to define the pole surfaces and a magnetic yoke bridging the two poles 26, 28 may couple the other sides of the magnets.

The described magnetron was originally developed for rectangular panels having a size of about 400 mm×600 mm. However, over the years, the panel sizes have continued to increase, both for economy of scale and to provide larger display screens. Reactors are being developed to sputter onto panels having a size of about 2 m×2 m. One generation processes a panel having a size of 1.87 m×2.2 m and is called 40K because its total area is greater than 40,000 $cm^2$. A follow-on generation called 50K has a size of greater than 2 m on each side. The widths of linear magnetrons are generally constrained to be relatively narrow if they are to produce a high magnetic field. As a result, for larger panels having minimum dimensions of greater than 1.8 m, linear magnetrons become increasingly ineffective, requiring longer deposition periods to uniformly sputter the larger targets.

In one method of accommodating larger targets, the racetrack magnetron 24 of FIG. 2 is replicated up to nine time in the transverse direction along the scanning direction to cover a substantial portion of the target. See U.S. Pat. No. 5,458,759 to Hosokawa et al. Scanning is still desired to average out the magnetic field distribution. However, there are several disadvantages to this approach. First, the separated magnetrons are not believed to optimally utilize the magnetic fields of the constituent magnets. That is, the effective magnetic field is less than is possible. Secondly, a significant number of particles have been observed to be produced during striking of the plasma at the portions of the magnetron near to the plasma dark space shields, which are adjacent to the arc portions 34 of the outer pole 28 of the racetrack magnetron 24. It is believed that electrons leak from the plasma to the nearby shield. Striking voltages of about 800 VDC are required. Such high voltages are believed to disadvantageously produce excessive particles. Thirdly, the prior art using one racetrack magnetron 24 of FIG. 2 reciprocally scans the magnetron at a relatively high speed to perform approximately 30 to 40 scans during a typical one minute sputter deposition period. Such a high scanning rates require a difficult mechanical design for the much heavier magnetrons covering most of the larger target. Fourthly, scanning magnetrons including one or more racetrack magnetrons do not completely solve the uniformity problem. The lateral edge portions of the target 16 underlying the ends of the racetrack magnetron 24 receive a high time-integrated magnetic flux because the arc portions 34 extend in large part along the scan direction. Also, the axial edge portions of the target underlying the magnetron when the scan direction reverses also receive a high time-integrated magnetic flux because of the finite time need to reverse directions. Thus, the target edges are disproportionately eroded, reducing the target utilization and target lifetime, as well as contributing to non-uniform deposition.

SUMMARY OF THE INVENTION

One aspect of the invention includes a magnetron having a convolute plasma loop, particularly one having a generally rectangular outline. The loop may be arranged in a serpentine shape having parallel straight portions connected by curved portions or in a rectangularized helical shape having straight portions arranged along orthogonal directions. The plasma loop may be formed between an inner magnetic pole of one magnetic polarity formed in a convolute shape surrounded by an outer pole of the opposed magnetic polarity. Preferably, the inner magnetic pole has a simple folded shape describable as extending along a single path with two ends. The uniformity of the sputter erosion is increased if one or two external ends of the plasma loop are extended in tails extending outwardly of the useful rectangular outline.

The convolute shape follows a path preferably having straight portions constituting at least 50% and preferably more than 75% of the total path length.

The plasma loop follows a folded track bracketed by the two poles with parallel portions separated by a pitch of between 50 to 125 mm, 75 mm having been established to provide superior results. The scan should be over a distance greater than the pitch, for example, at least 10 mm greater.

The magnetron is only somewhat smaller than the target being scanned, and the target may be relatively large in correspondence to a rectangular flat panel substrate with a minimum dimension of at least 1.8 m. The magnetron may have effective fields extending within an area having sides that are at least 80% and even more than 90% of the corresponding dimensions of the target.

Another aspect of the invention includes scanning a magnetron along two dimensions of a rectangularly shaped target. It is possible to scan along a single diagonal of the rectangular target. It is, however, preferable, that the two dimensions of scanning not be fixed together. The scan speed can be relatively low, for example 0.5 to 5 mm/s with corresponding scan periods of between 20 to 200 s. A single scan period may be sufficient for a panel.

A preferred scan pattern is a double-Z including a continuous scan along two opposed sides of a rectangle aligned with the lateral sides of the target and along the two diagonals connecting the ends of the rectangle sides. The target power may be turned off or reduced on the scan along the sides or may be left on if the magnetron is sufficiently spaced from the frame at the edge of the target. The double-Z scan may be repeated with small displacements between the scans, preferably in a direction perpendicular to the two lateral sides. The displacement offsets may be in a range of 5 to 15 mm, preferably 8 to 12 mm.

Diagonal and other scans oblique to the Cartesian coordinates of the target are preferably achieved in a zig-zag pattern along the Cartesian coordinates with each of the rectilinear portions of the zig-zag pattern preferably having a length of between 0.4 to 3 mm and more preferably 0.8 to 1.2 mm.

Yet another aspect of the invention moves the scanned magnetron away from the grounded frame or shield defining the chamber wall before igniting the plasma, preferably by a distance of between 1 and 5 mm.

DETAILED DESCRIPTION OF THE PREFERRED EMBODIMENTS

Figure 2:
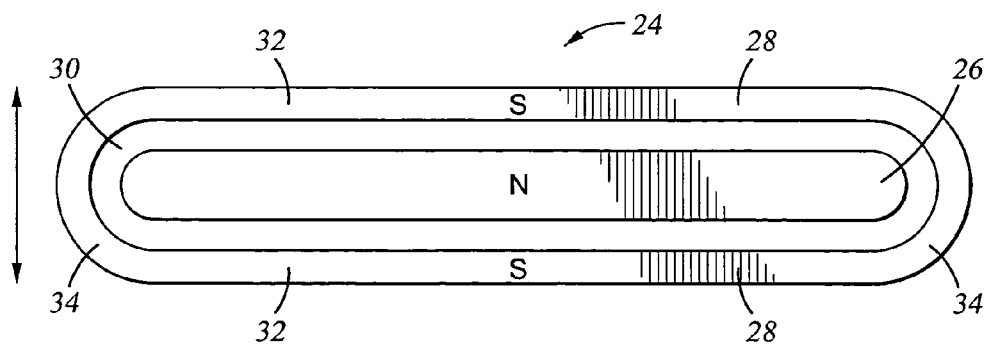
FIG. 2 is a plan view of a convention linear, racetrack magnetron usable with the sputter reactor of FIG. 1.
Figure 3:
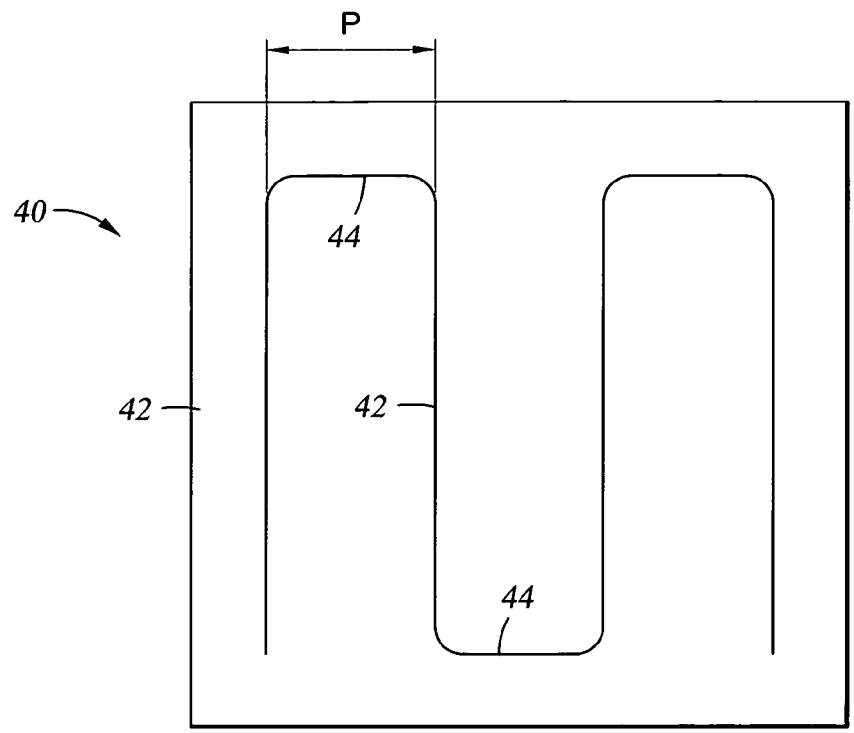
FIG. 3 is a schematic plan view of a serpentine magnetron according to one aspect of the invention.
Figure 4:
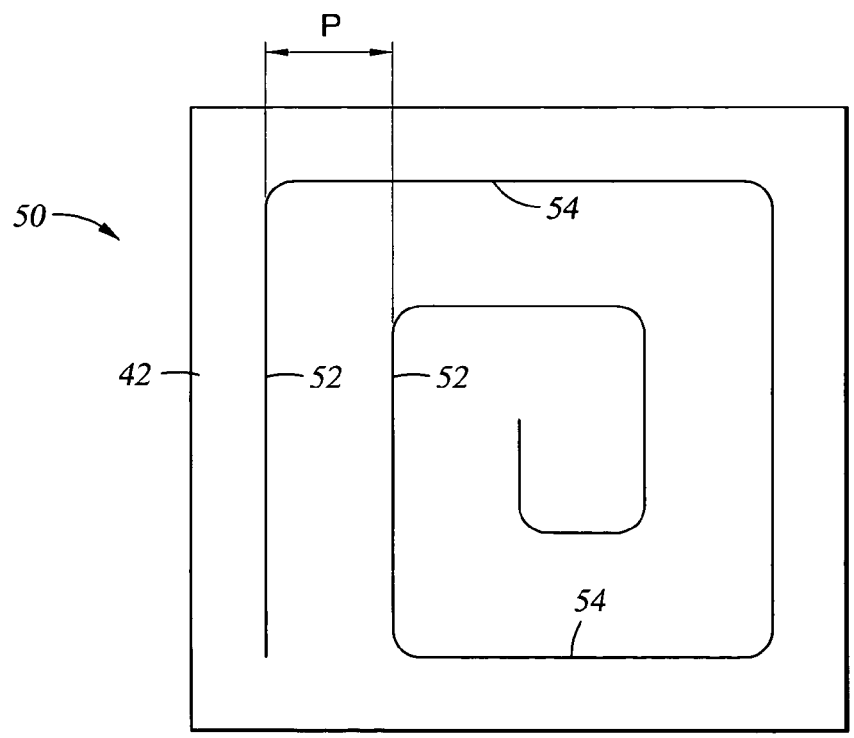
FIG. 4 is a schematic plan view of a rectangularized spiral magnetron of the invention.

One aspect of the invention includes more convoluted shapes for the magnetron than the linear racetrack of FIG. 2. In one embodiment illustrated schematically in FIG. 3, a serpentine magnetron 40 formed in a magnetron plate 42 includes multiple long parallel straight portions 42 arranged on a pitch P smoothly joined by end portions 44, which may be arc shaped or alternatively short straight portions with curved corners connecting to the straight portions 42. Since the magnetrons described herein are generally shaped to form a closed plasma loop, the illustrated pitch P will be called the loop pitch to distinguish it from a track pitch to be described later. The effective area of the serpentine magnetron 40 defined by the outer generally rectangular outline of the magnetic field distribution parallel to the target face is a substantial fraction of target area. The serpentine magnetron 40 may be scanned transversely to the long straight portions 42 across a distance closely related to and of the order of the pitch P in order to completely scan the target area and more uniformly sputter material from that area of the target.

In a related embodiment, a spiral magnetron 50 includes a continuous series of straight portions 52 and 54 extending along perpendicular axes and smoothly joined together in a rectangular spiral. Neighboring parallel straight portions 52 or 54 are separated by a track pitch Q. The spiral magnetron 50 may be scanned in one of the rectangular directions over the track pitch Q, for example along the straight portions 54.

Figure 5:
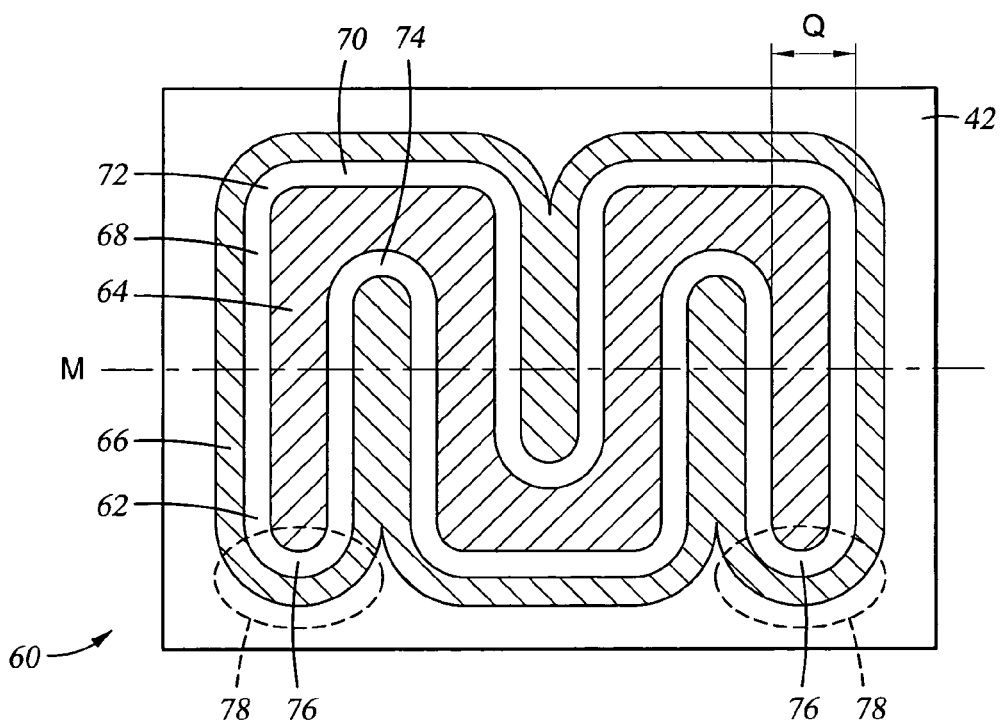
FIG. 5 is a more realistic plan view of a serpentine magnetron.

The magnetron shapes illustrated above are somewhat schematic. The number of folds in either magnetron 40, 50 may be significantly increased. Although it is not necessary, each of the magnetrons may be considered a folded or twisted version of an extended racetrack magnetron of FIG. 2 with a plasma loop formed between the inner pole and the surrounding outer pole. When the linear magnetron 24 of FIG. 2 is folded, the poles of neighboring folds may merge. As shown in plan view in FIG. 5, a serpentine magnetron 60 is formed of a closed serpentine gap 62 between an inner pole 64 and an outer pole 66 completely surrounding the inner pole 64. The plasma loop, includes two closely spaced anti-parallel propagating plasma tracks separated by a track pitch Q and folded to form a structure that is generally periodic in the illustrated x-direction with a period of the track pitch Q. The single folded track and hence the magnetron have a shape generally following long straight portions 68 extending symmetrically in one direction about a medial line M and shorter straight portions 70 extending in the other directions. Curved portions 72, 74, 76 connect the straight portions 68, 70. The inner curved portions 74 and end curved portions 76 curve sharply around 180°. The figure illustrates that the outermost portions of the outer pole 66 are thinner than the inner portions indicating the relative magnetic flux density. It is understood that the serpentine magnetron 60 may include additional folds of the plasma loop, particularly for larger target sizes.

Figure 6:
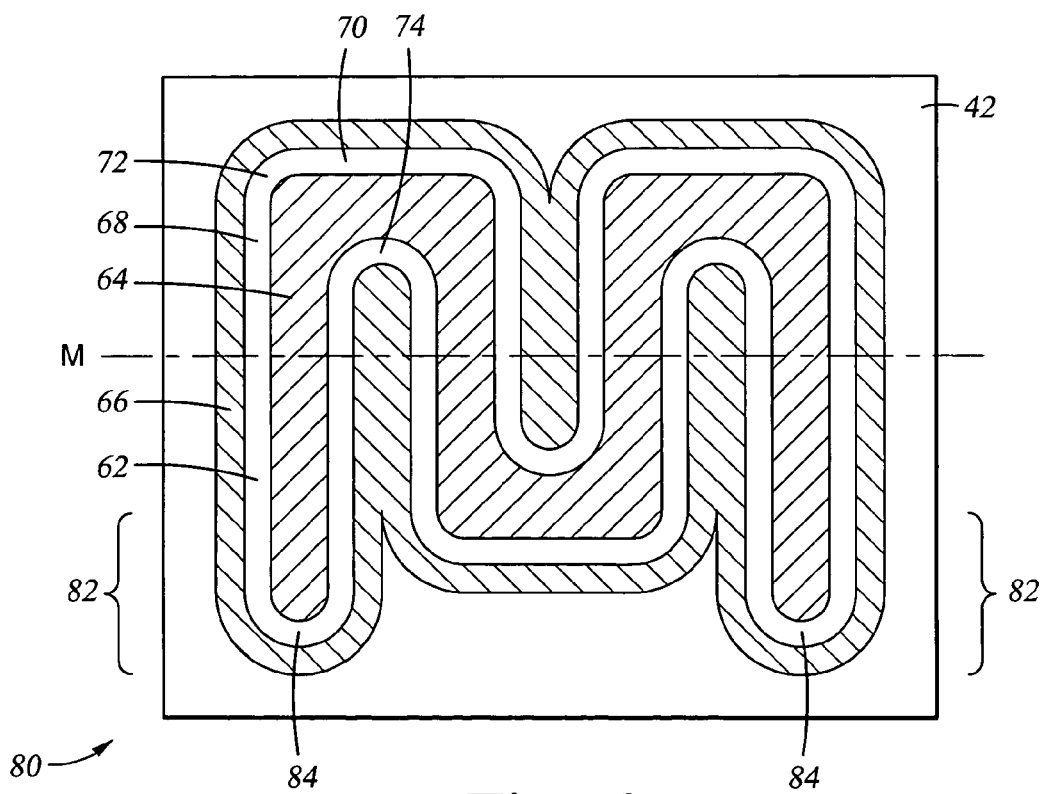
FIG. 6 is a plan view of an improved serpentine magnetron.

However, when such a serpentine magnetron 60 was tested, areas 78 of the target underlying the end curved portions 76 of the magnetron 60 demonstrated very low sputtering rates. Rather than increasing the scan length or increasing the entire size of the magnetron, an improved serpentine magnetron 80 illustrated in the plan view of FIG. 6 includes tail portions 82 in which both the inner and outer poles 64, 66 have been extended in the region surrounding end curved portions 84 of the gap 62 so that the end curved portions 84 are outside of a rectangular outline of the useful area of the magnetron 80. As a result, the less eroded regions 78 of FIG. 5 fall outside of the useful target area. The target may need to be enlarged somewhat to accommodate the tail portions 82 but, since little sputtering occurs there, the tail portions 82 may extend closer to the target periphery than the remainder of the magnetron 80 and perhaps may extend over the edge of the target. It is understood there if the plasma loop has an odd number of folds, the two tail portions 82 occur on opposed lateral sides of the magnetron plate 42.

Figure 7:
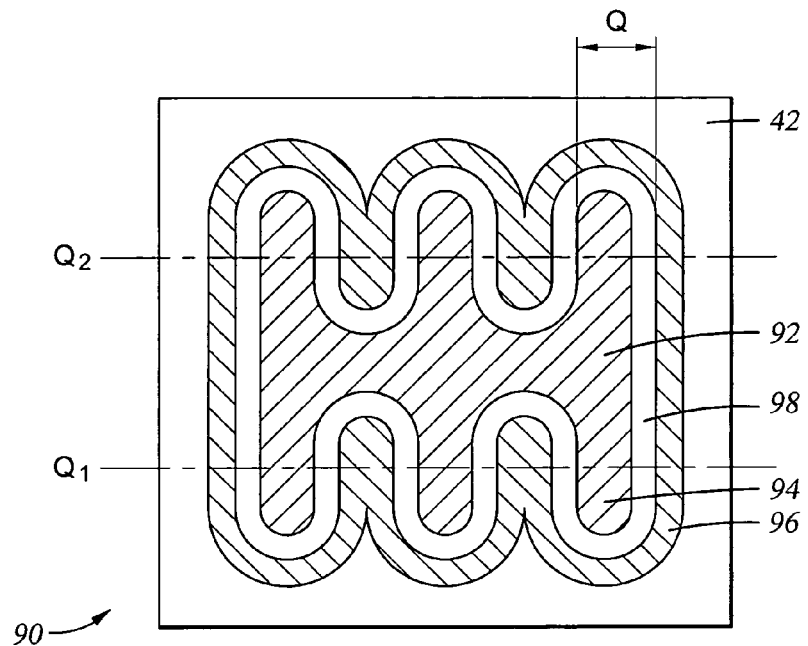
FIG. 7 is a plan view of an alternative embodiment of a serpentine magnetron.

A double-digitated magnetron 90, shown in plan view in FIG. 7 includes an inner pole 92 formed of two opposed rows of generally straight teeth portions 94 and a surrounding outer pole 98 separated from the inner pole by a closed gap 98. The straight portions of the gap 98 are arranged about two general symmetry lines $Q_1$ and $Q_2$. The serpentine magnetrons 60, 80 and double-digitated magnetron 90, although visually different, are topologically similar and provide similar magnetic field distributions. Both advantageously have straight portions constituting at least 50% and preferably more than 75% of the total track length. The digitated magnetron is, however, distinguished from the serpentine magnetron and the helical magnetron to be described later by its inner pole 92 having a complex shape with many projections and not describable in terms of a single path. In contrast, the inner pole of the serpentine and helical magnetrons has a nearly constant width follows a single convolute or folded path extending from one end to the other. Expressed differently, the inner pole of serpentine and helical magnetrons has only two ends defining ends of the closed plasma loop while the inner pole of the digitated magnetron has three or more ends with many equivalent ends to the plasma loop. As will be described later, these ends cause some difficulty apparently associated with their tight curvature and it may be advantageous to minimize their number. Hope et al. disclose a single-digitated magnetron in U.S. Pat. No. 4,437,966.

Figure 8:
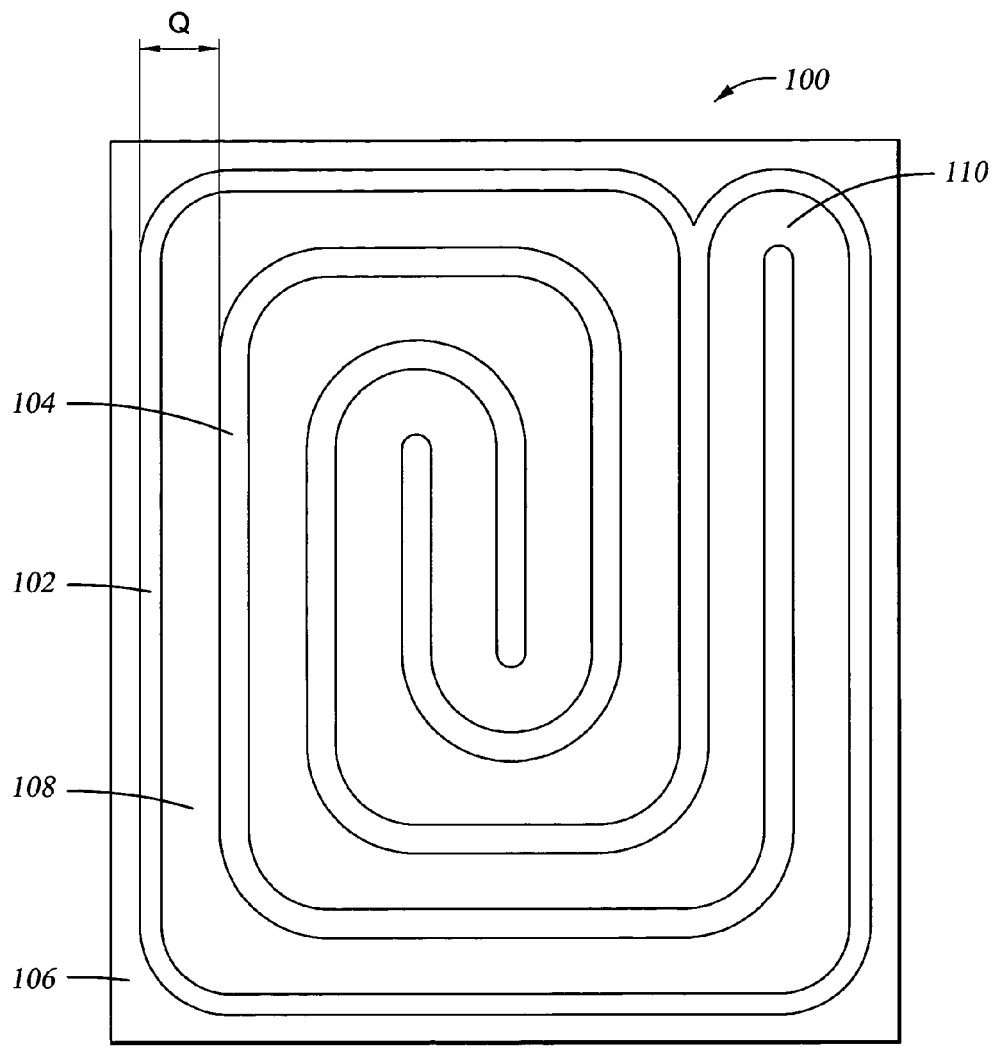
FIG. 8 is a more realistic plan view of a rectangularized spiral magnetron.

A rectangularized spiral magnetron 100 illustrated in plan view in FIG. 8 includes continuous grooves 102, 104 formed in a magnetron plate 106. Unillustrated cylindrical magnets of opposed polarities respectively fill the two grooves 102, 104. The groove 102 completely surrounds the groove 104. The two grooves 102, 104 are arranged on a track pitch Q and are separated from each other by a mesa 108 of substantially constant width. In the context of the previous descriptions the mesa 108 represents the gap between the opposed poles. The one groove 102 represents the outer pole. The other groove 104 represents the inner pole which is surrounded by the outer pole. Similarly to the racetrack magnetron, whether twisted or not, one magnetic pole represented by the groove 104 is completely surrounded by the other magnetic pole represented by the groove 102, thereby intensifying the magnetic field and forming one or more plasma loops to prevent end loss. The width of the outermost portions of the groove 102 is only slightly more than half the widths of the inner portions of that groove 102 and of all the portions of the other groove 104 since the outermost portions accommodate only a single row of magnets while the other groove portions accommodate two rows in staggered arrangements. The grooves 102, 104 of the magnetron 100 may be modified to include a tail portion around a 180° curved end 110 of the mesa 108, similar to the tail portions 82 of FIG. 6. A single magnetic yoke plate may cover the back of the magnetron plate 106 to magnetically couple all the magnets.

The rectangularized spiral magnetron has grooves 102, 104 and hence poles having straight portions extending along perpendicular directions and joined to each other by curved corners. The straight portions advantageously constitute at least 50% and more advantageously 75% of the total length of the pattern.

The grooves 102, 104 generally represent the two poles. However, the structure is more complex. The grooves 102, 104 are machined into the magnetron plate 42 and include arrays of cylindrical holes to accommodate the individual cylindrical permanent magnets. The cylindrical holes within the thicker portions of the grooves 102, 104 may form two linearly extending parallel rows staggered with respect to each other to increase the magnet packing density. The outside portions of the grooves 102, 104 on the other hand may have only one such linear array. Two pole pieces typically formed of magnetically soft stainless steel have the shape and approximate widths of the grooves 102, 104. Screws fasten the pole pieces to the bottom of the magnetron plate over grooves 102, 104 to both capture the magnets within the downwardly facing grooves 102, 104 and to act as magnetic pole pieces.

Other convolute shapes for the magnetron are possible. For example, serpentine and spiral magnetrons can be combined in different ways. A spiral magnetron may be joined to a serpentine magnetron, both being formed with a single plasma loop. Two spiral magnetrons may be joined together, for example, with opposite twists. Two spiral magnetrons may bracket a serpentine magnetron. Again, a single plasma loop is desirable. However, multiple convolute plasma loops enjoy some advantages of the invention.

The serpentine magnetrons 60, 80 have one principal set of straight sections 68 while the rectangularized magnetron 90 has two sets of parallel straight sections, both of which may be considered principal sets. All the magnetrons 60, 80, 90, 100 benefit from one-dimensional scanning over the pitch P in a direction transverse to one of the principal sets of straight sections. However, such one-dimensional scanning still suffers some deficiencies. First, uniformity of sputtering greatly suffers because there are substantial portions of the magnetron which extend in directions having components parallel to the scan direction. The effect is most pronounced in the serpentine magnetrons 60, 80 in which the short straight sections 70 cause the lateral edges of the target to be eroded more quickly than the central medial portion of the target. The non-uniformity is reduced for the spiral magnetron 100. Nonetheless, these magnetrons still erode the central medial portion of the target less than the more lateral portions. Secondly, unless other precautions are taken, all the magnetrons continue to create a plasma adjacent the lateral edges of the target near the plasma shields. As previously explained for the linear racetrack magnetron, the proximity greatly increases the production of particles during plasma ignition. Thirdly, there continues to be an end dwell over erosion when the magnetron is rapidly and reciprocally scanned.

Figure 9:
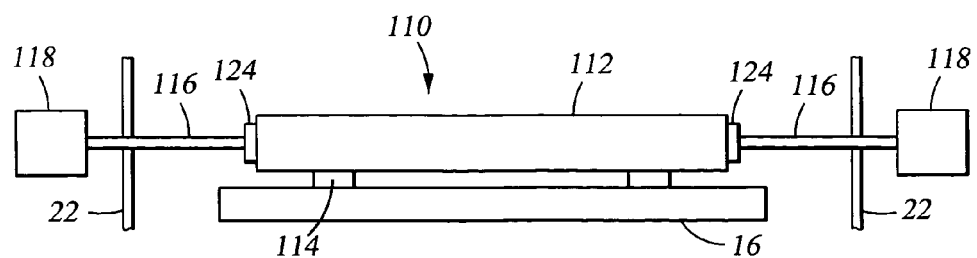
FIG. 9 is an elevational view of a linear scan mechanism having the magnetron slidably supported on the target.

Sputtering uniformity can be increased by scanning a convoluted magnetron in two orthogonal dimensions over a rectangular target. The scanning mechanism can assume different forms. In a scanning mechanism 110 illustrated in FIG. 9 the target 16 supports on its back, top side a magnetron plate 112 including the magnets through a plurality of insulating pads 114 or bearings held in holes at the bottom of the magnetron plate 112. The pads 114 may be composed of Teflon and have a diameter of 5 cm and protrude from the magnetron plate 112 by 2 mm. Opposed pusher rods 116 driven by external drive sources 118 penetrate the vacuum sealed back wall 22 to push the magnetron plate 112 in opposite directions. The motive sources 118 typically are bidirectional rotary motors driving a drive shaft having a rotary seal to the back wall 22. A lead screw mechanism inside the back wall 22 converts the rotary motion to linear motion. Two perpendicularly arranged pairs of pusher rods 116 and motive sources 118 provide independent two-dimensional scanning. A single pair of pusher rods 116 and motive sources aligned along the target diagonal provide coupled two-dimensional scanning relative to the sides of the target. Other types of actuators are possible including pneumatic cylinders, stepper motors, and rack-and-pinions, both inside and outside of the low-pressure back chamber.

Figure 10:
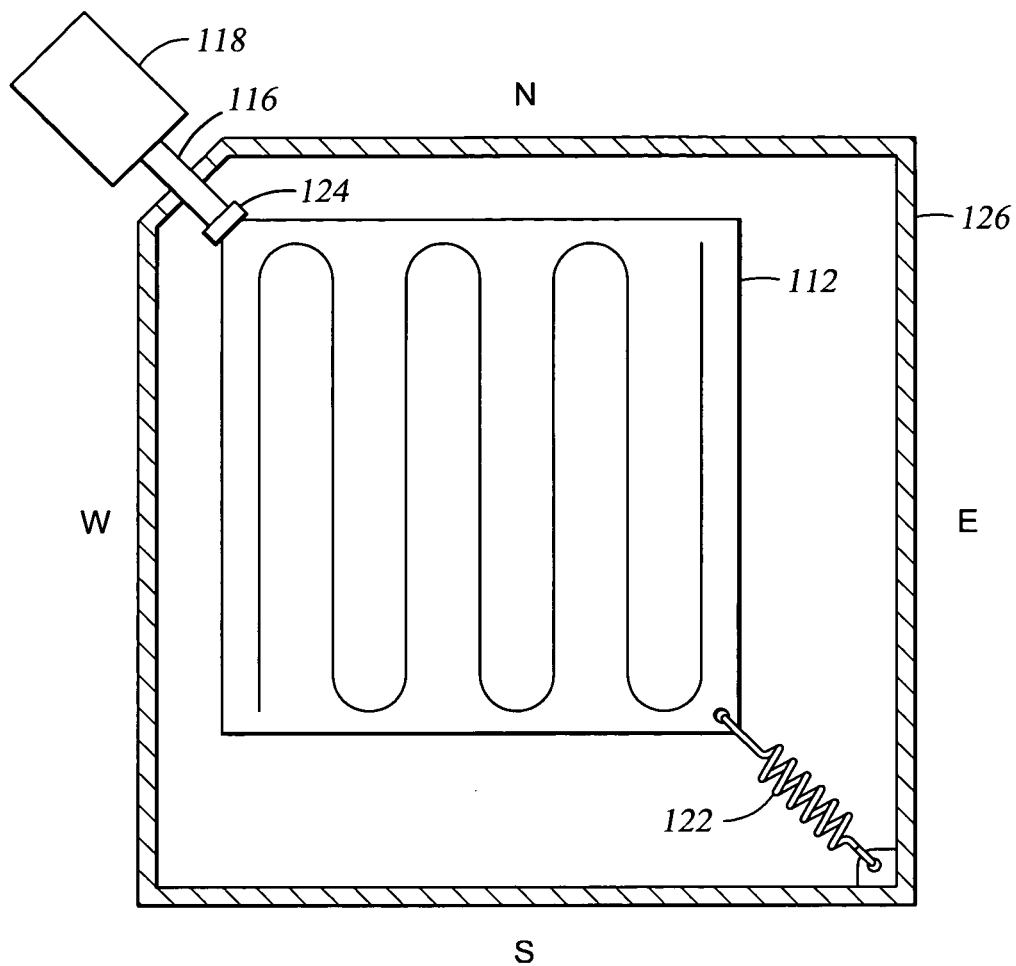
FIG. 10 is plan view of diagonal scan mechanism.

As illustrated in the plan view of FIG. 10, a spring 122, particularly a compression spring in the illustrated geometry, may replace one of the opposed pusher rods. Also, a coupling 124 between the rod 116 and the magnetron plate 112 may be fixed so that one rod 116 can both push and pull the magnetron plate 112 or, in view of the bidirectional actuation in FIG. 9, the coupling 124 may be formed of a rotatable wheel selectively and smoothly pushing the magnetron plate 112.

Other types of scanning mechanisms are possible. The sliding pads 114 can be replaced by wheels or ball or roller bearings, but preferably the wheels or bearings are electrically insulating to leave the magnetron plate 112 grounded while being supported on the biased target 16. For simple motions, a guide plate intermediate the magnetron plate 112 and target 16 guides the scanning. As has been described in the aforecited Halsey patent, the magnetron plate 112 may be supported from above by one or more guide plates through wheels and support rods.

The amount of scan may be relatively limited. For example, for a magnetron with a pitch of 75 mm between neighboring anti-parallel tracks and designed for a 2 m target, the scan distance should be at least 75 mm. To allow for variable magnet strength and position, it is recommended that the scan distance be at least 10 mm larger. Scan distances of more than 50% greater than the pitch detract from the advantages of the invention. Experiments have show that scan distances in the range of 85 to 100 mm provide superior erosion. A pitch of 75 mm between magnet grooves and hence between plasma tracks has proven quite effective, indicating a preferred range of 50 to 125 mm for the pitch.

To accomplish a first scanning pattern, a convoluted magnetron formed in a magnetron plate 112, as illustrated in plan view in FIG. 10, is supported within a rectangular frame 126 forming part of the back wall 22. Although a serpentine magnetron is illustrated, other magnetron shapes may be used. The actuator 118 coupled to the magnetron plate 112 drives it along a diagonal of the frame 126, that is, in the northwest to southeast direction which is both parallel to and transverse to the direction of the principal set of straight portions of the magnetron. In the illustrated embodiment, the spring 122 acts in opposition to the actuator 118. As a result of the diagonal scanning, the over erosion on the north and south sides of the target is reduced.

The scanning benefits from two operational characteristics. First, the scanning may be advantageously performed at a relatively low speed of about 1 mm/s so that a complete deposition is performed in a single scan of the frame diagonal or, as will be explained later, in a few such diagonal scans. Very good results have been obtained with a scan speed of 2 mm/s indicating a preferred range of 0.5 to 5 mm/s. For a 100 mm scan, a complete scan can be accomplished in 20 to 200 s. The slow speed simplifies the heavy mechanics. Secondly, it is advantageous to start the slow scan with the plasma extinguished and to strike the plasma after the magnetron has departed from the immediate vicinity of the grounded frame 126, for example, after an initial scan of 2 mm indicating a preferred range of 1 to 5 mm. The delayed striking allows the scan speed to equilibrate. More importantly, however, striking away from the frame 126 significantly reduces the production of particles, which are believed to originate from uncontrolled arcing during the plasma striking.

Figure 11:
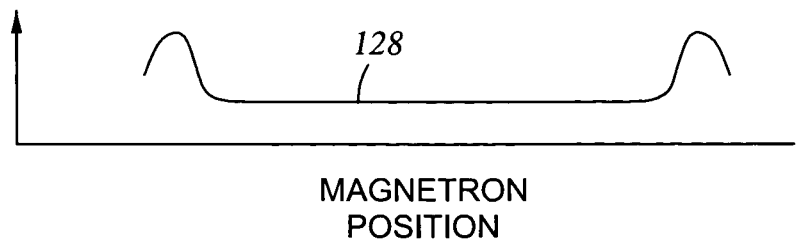
FIG. 11 is a graph showing the variation of target voltage with scan position.

Experiments have been performed in which a racetrack magnetron is scanned across the frame with a constant power supply. The target voltage is observed, as indicated by plot 128 in the graph of FIG. 11, to rise from about 500V in the middle to near 600V near the frame or shield, indicating dependence of the plasma impedance upon the magnetron position. This high voltage adjacent the frame is believed to result from electron leakage to the frame and is associated with excessive arcing during striking. If the plasma is instead struck in the flat portion of the curve, arcing is substantially reduced. Advantageously also, the plasma is extinguished before the magnetron reaches the other diagonal corner. If further deposition is to be performed on the same substrate, it is alternatively possible to reduce the target power to achieve a lower-density plasma rather than to completely extinguish the plasma, thereby significantly reducing the generation of particles at the target edge. It is also observed that the target voltage with the rectangularized helical magnetron of FIG. 8 is only about 350V, indicating a very efficient magnetron.

It is possible to extend the scan to a back-and-forth scan along the frame diagonal with the plasma so that the magnetron is returned to its original position ready for sputtering onto the next panel. Alternatively, the back scan can be performed with the plasma turned off while a new panel is being placed in the sputter reactor and the sputter chamber is pumped down and equilibrated. In a further alternative, one panel can be sputter deposited during a forward scan and a second panel is deposited during the subsequent back scan.

Figure 12:
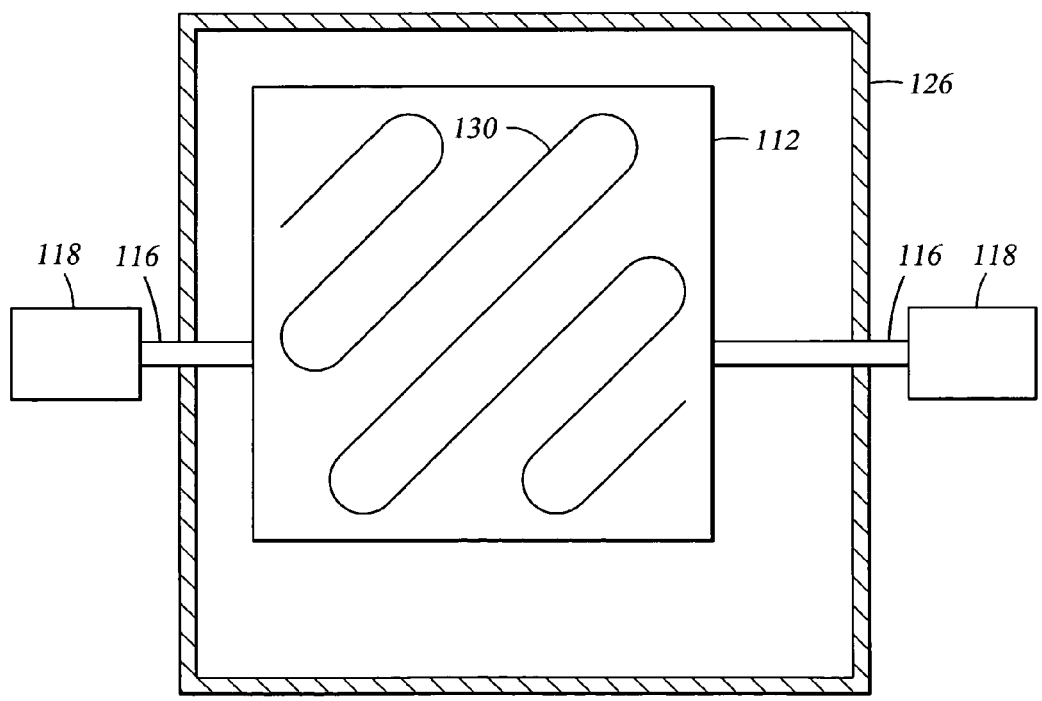
FIG. 12 is plan view of a linear scan mechanism combined with an inclined magnetron achieving some of the results of a diagonal scan.

A somewhat similar effect can be obtained, as illustrated in FIG. 12, with a magnetron 128 formed in the magnetron plate 112 with its one or two principal sets of straight sections formed at an inclined angle with respect to the rectangular coordinates of the frame 126, for example, at 45° or parallel to the frame diagonal. Two opposed actuators 118 aligned along one of the two rectangular coordinates scan the magnetron plate 112 along that coordinate. In this embodiment, the scan is one-dimensional but the magnetron shape is two-dimensional. To avoid edge effects upon striking, extra target space should be provided along the lateral sides.

Figure 13:
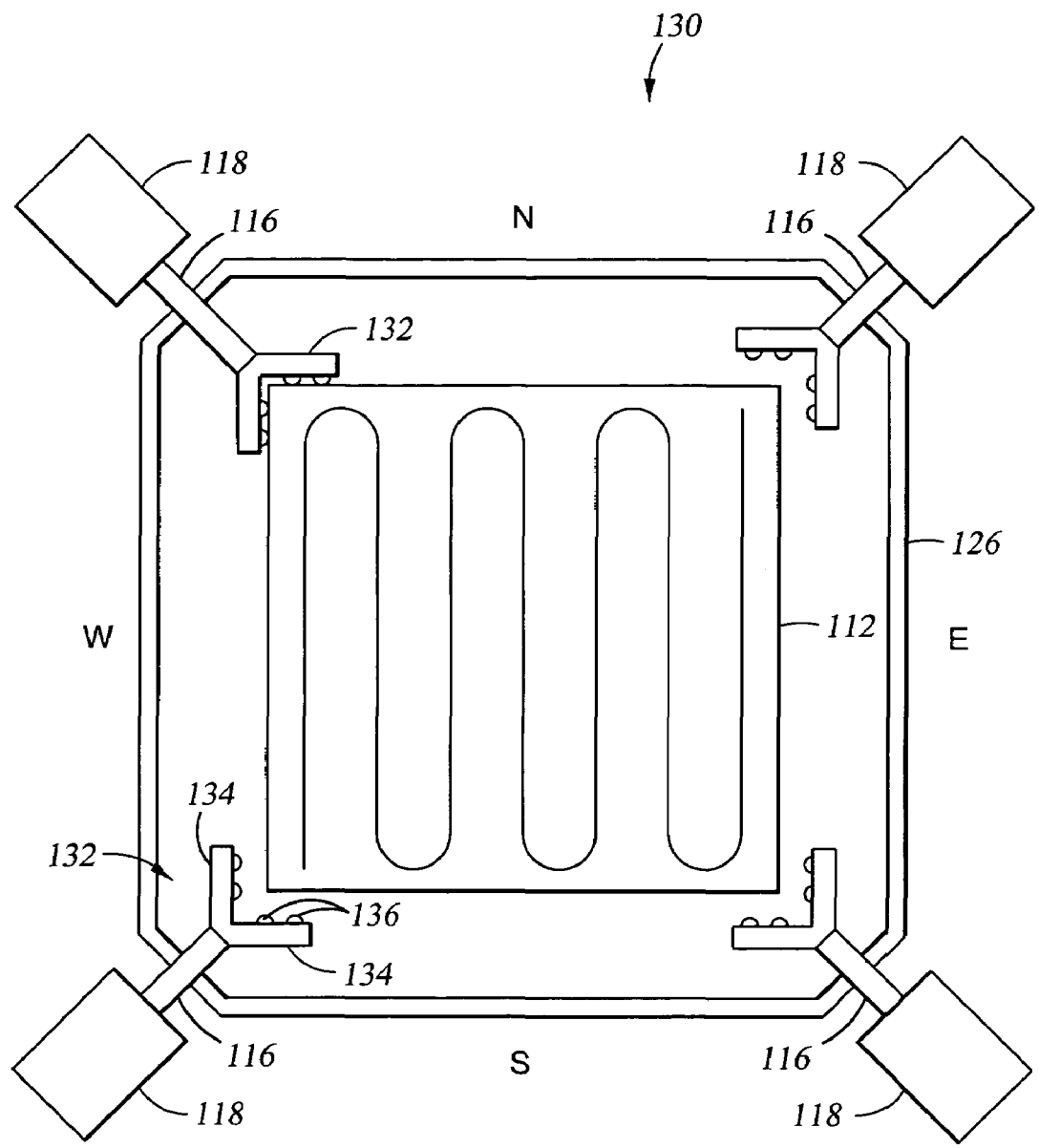
FIG. 13 is a plan view of a first embodiment of a two-dimensional scan mechanism.

Scanning along two diagonals is achievable with the scan mechanism 130 illustrated in FIG. 13. Four actuators 118 located at the corners of the frame 126 are aligned in opposed pairs along the two frame diagonals. Each actuator 118 is fixed to a corner pusher 132 having two perpendicular arms 134, each having a plurality of wheels 136 or other sliding means which can smoothly engage and align the respective corners of the magnetron plate 112 to accurately push it along one of the frame diagonals. Although a serpentine magnetron is illustrated, other convolute magnetron shapes may be used with this and other two-dimensional scanning mechanisms. Scanning along either diagonal requires only varying one of the actuators. The scanning can be transferred from one diagonal to the other by pushing the magnetron plate 112 along the first diagonal by one of the actuators 118 aligned with that first diagonal to a central point through which the second diagonal passes. Thereafter, one of the actuators 118 aligned with the second diagonal engages the magnetron plate 112 to push it along the second diagonal.

Figure 14:
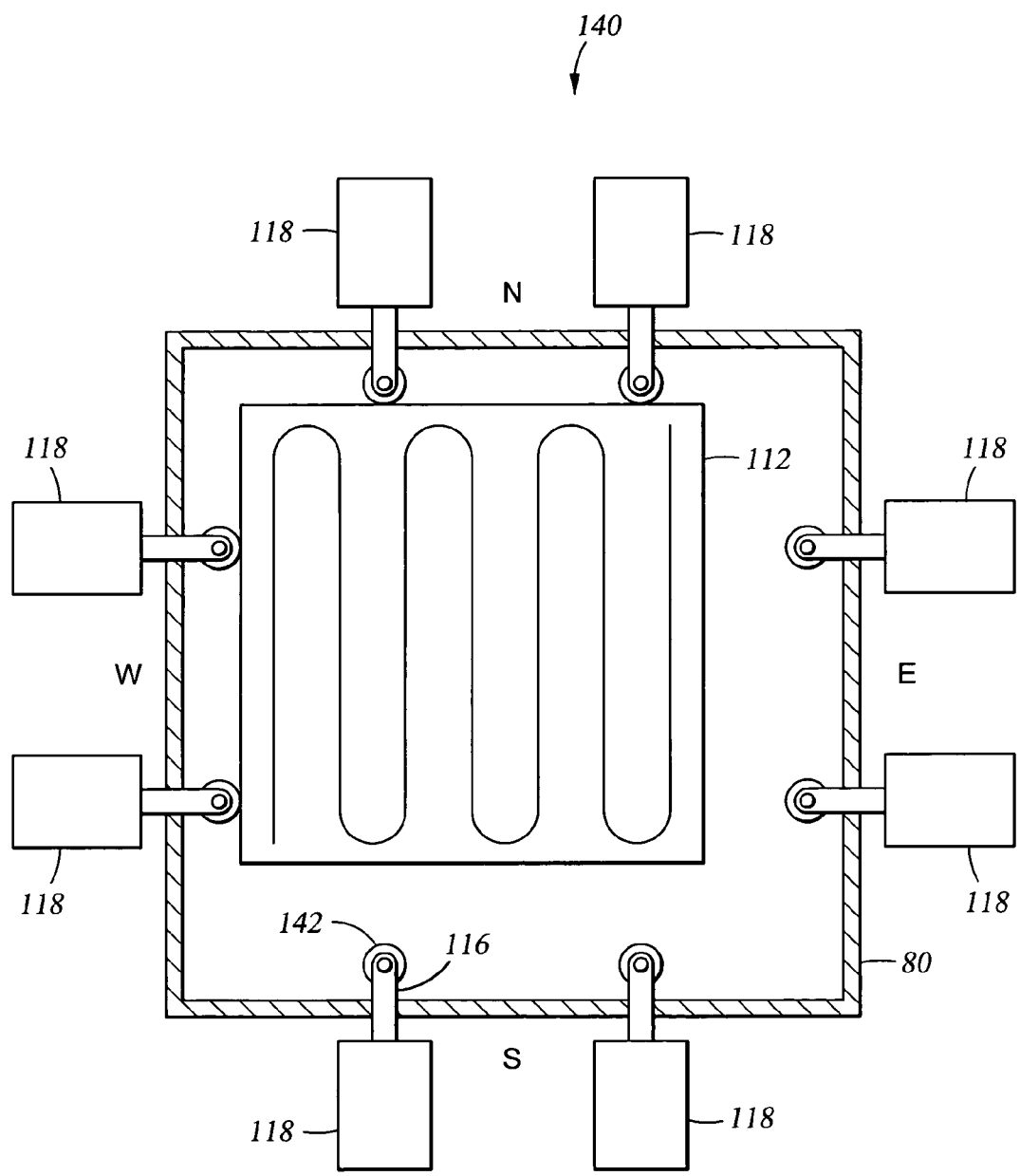
FIG. 14 is a plan view of a second embodiment of a two-dimensional scan mechanism.

A rectangularly arranged scanning mechanism 140, illustrated in FIG. 14, includes eight actuators 118 arranged in pairs along the four sides of the rectangular frame 126. The paired actuators 118 are controlled alike to execute a same extension of the associated arms 116. The pairing is preferred when the there is no fixed coupling between the actuators 118 and the magnetron plate 82 but only a pushing force is executed. A preferred coupling from the arms 116 of the actuators 118 include a respective wheels 142 or other rotatable member on the end of each actuator rod 116. However, soft pusher pads, for example of Teflon, may be substituted for the wheels 142. Only a pair of wheeled actuator rods 116 need to engage the magnetron plate 112 to move it along a Cartesian direction.

Figure 15:
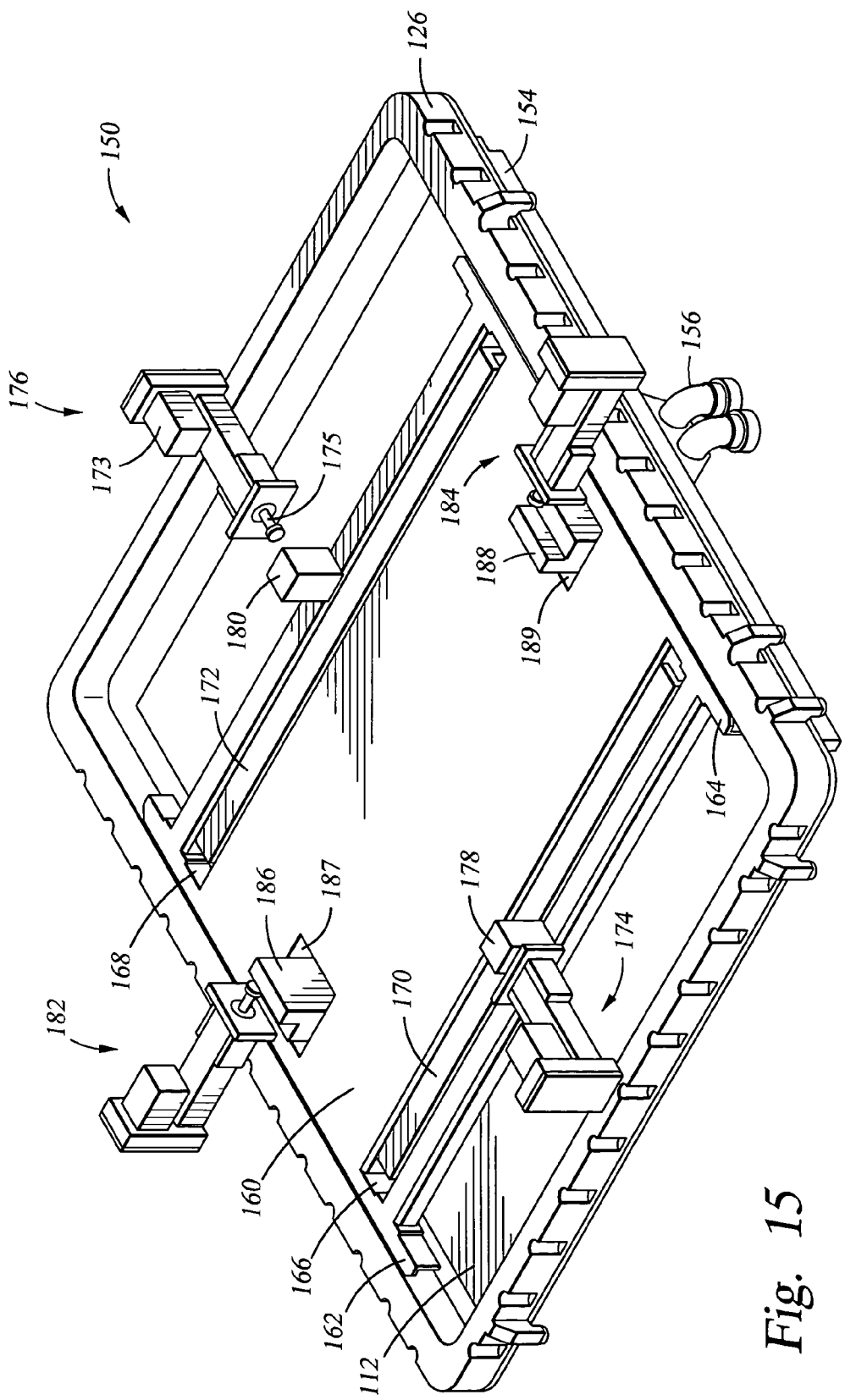
FIG. 15 is an orthographic view of a third embodiment of a two-dimensional scan mechanism and a support structure for the magnetron.

Another scan mechanism 150, illustrated orthographically in FIG. 15, is supported on the frame 126, which in turn is supported on the periphery of the target backing plate. A cooling manifold 154 distributes cooling fluid from supply lines 156 to the target backing plate. A slider plate 160 includes two inverted side rails 162, 164 which slide in a first direction along and on top of respective series of wheel bearings mounted on the frame 126. Two slits 166, 168 are formed in the slider plate 160 to extend in the perpendicular second direction. Two inverted rails 170, 172 supporting the magnetron plate 112 extend through the two slits 166, 168 are slidably supported on respective series of wheel bearings mounted on the slider plate 160 to allow motion in the second direction. That is, the magnetron plate 112 and associated magnetron can slide in the perpendicular first and second directions. Further, the heavy magnetron is supported on the frame 126 and the periphery of the target backing plate, itself directly supported on the chamber wall, and not on the relatively thin cantilevered inner portions of the target and target backing plate.

A first set of actuators 174, 176 opposed along the direction of the slider rails 162, 164 are supported on the frame and includes respective independently controlled bidirectional motors 173, gear boxes, and worm gears driving pusher rods 175, which selectively abut, engage, and apply force to respective bosses 178, 180 extending upwardly from the slider plate 160. A second set of similarly configured actuators 182, 184 opposed along the direction of the magnetron plate rails 170, 172 are supported on the frame 126 to selectively engage respective bosses 186, 188 fixed to the magnetron pate 112 and extending upwardly through holes 187, 189 in the slider plate 160.

The two sets of actuators 174, 176, 182, 184 can be used to move the magnetron plate 160 in orthogonal directions. The bosses 186, 188 fixed to the magnetron plate 112 have relatively wide faces so that the associated actuators 182, 184 and pusher rods 175 can engage them as the other set of actuators 174, 176 are moving the magnetron plate 112 in the transverse direction.

The illustrated structure is covered by a roof, which is supported on and vacuum sealed to the frame 126 and includes movable vacuum means, for example adjacent to the actuators 174, 176, 182, 184 and in the boss holes 166, 168, 187, 189 to allow the area beneath the roof to be vacuum pumped. The roof includes trusses to withstand atmospheric pressure over the large roof area when the interior is pumped to a relatively low pressure so as to subject the thin target and backing plate to a much reduced pressure differential against the high-vacuum sputter chamber.

Figure 1:
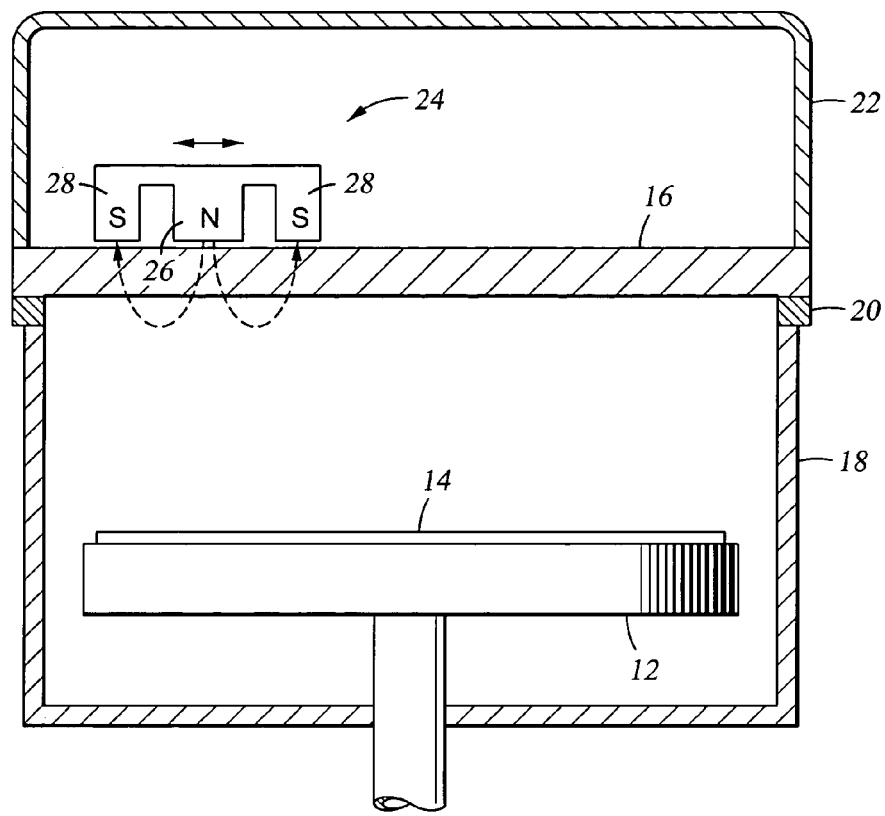
FIG. 1 is a schematic side view of a convention plasma sputter reactor configured for sputter depositing onto a rectangular flat panel.

The reactor of FIG. 1 is typically controlled by an unillustrated computerized control system operating in accordance with a recipe set for processing a sequence of panels 14. The control system controls a DC power supply powering the target 16, a vacuum pumping system pumping the interior of the sputtering chamber 18 to a desired low pressure, a slit valve connecting the chamber interior to a transfer chamber, and a robot disposed principally within the transfer chamber to transfer substrates 14 in and out of the sputtering chamber 18. The control system is additionally connected to the actuators 118 or 182, 184, 174, 176 to scan the large magnetron in a desired 2-dimensional pattern in back of the target 16.

Figure 16:
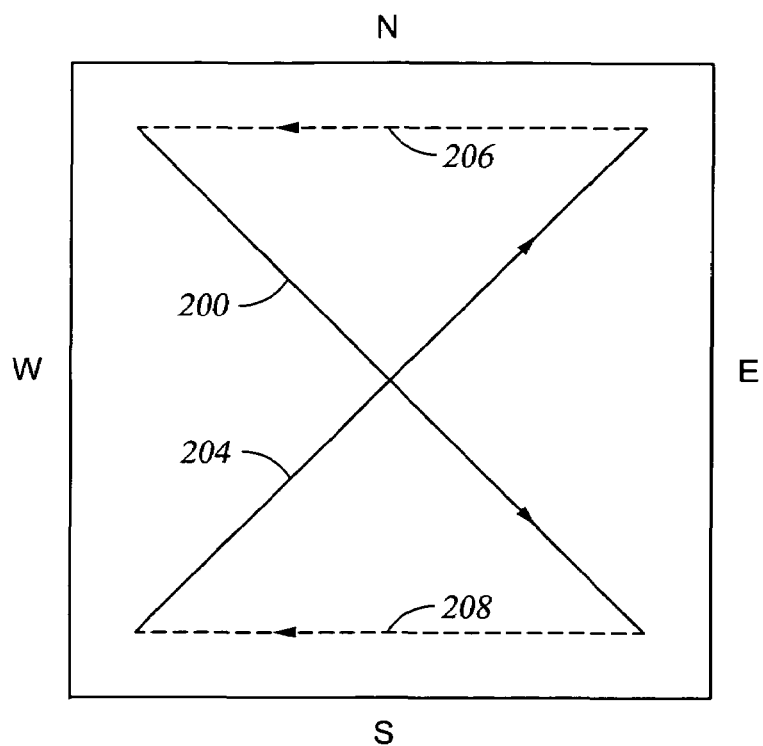
FIG. 16 is a map of a double-Z scan path.

The pairs of actuators 118 or 182, 184, 174, 176 are controlled in combination to effect a desired scanning pattern. One mode of operation replicates the diagonal scan of FIG. 10 along one frame diagonal, for example, northwest to southeast although a southwest to northeast scan is also possible. A second mode of operation improves the erosion uniformity by scanning, as illustrated in the map of FIG. 16, a double-Z pattern by performing a first deposition scan 200 along one diagonal direction and extinguishing the plasma (or reducing the target power) near the end of the diagonal scan 200. Thereafter, the magnetron is scanned near the target edge along a rectangular path 208 parallel to one Cartesian coordinate with the plasma extinguished or lessened. Then, a second deposition scan 204 with active plasma is performed along the other diagonal but the plasma is extinguished near the end of the diagonal. Finally, the magnetron is scanned back along a rectangular path 206 near the other target edge and anti-parallel to the one Cartesian (rectangular) coordinate with the plasma extinguished. This pattern will be referred to as a double-Z. It is noted that the indicated paths extend only over the scan dimensions, e.g. 75 or 100 mm, and not over the entire target having sides about 10 times larger. That is, the magnetron has an effective magnetic field extending within an area with sides that are 90% or greater of the corresponding dimensions of the target within the frame. With reference to a serpentine magnetrons 60, 80 of FIGS. 5 and 6, the double-Z scan can be performed so that the edge scans 206, 208 are performed either parallel to the principal set of straight sections 68 or perpendicular thereto.

The double-Z scan can be performed for a single substrate. Alternatively, a fresh substrate can be substituted during each of the rectangular scans 206, 208 while no plasma is excited and the chamber pressure and gaseous ambient are relatively unimportant. If the size of the double-Z pattern is small enough so that edge effects are avoided in the edge paths 206, 208 in the presence of a plasma, an advantageous scan pattern starts at the center at which the plasma is ignited. The plasma remains ignited while the magnetron is scanned through the complete double-Z pattern, finally ending back at the center. The plasma ignition thus occurs at the maximum distance from any portion of the grounded frame.

Figure 17:
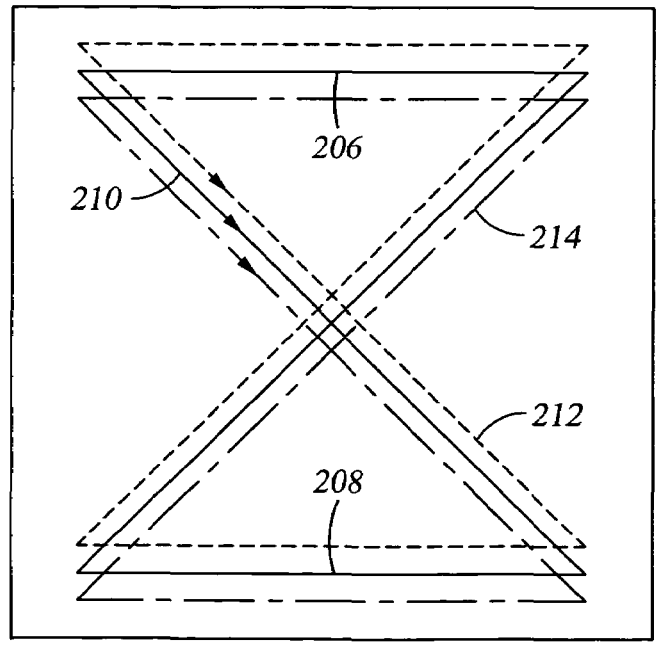
FIG. 17 is a map of a path for a sequence of offset double-Z scans.

The double-Z scan and other types of scan need not be precisely replicated from one step to the next. Target erosion uniformity, which determines target lifetime, can be improved by offsetting sequential double-Z scans. As illustrated in the map of FIG. 17 after a first, baseline double-Z scan 210, the pattern is displaced along one Cartesian coordinate by a small distance, for example, 10 mm, and preferably perpendicular to the side portions 206, 208 of the double-Z scan for performance of a second double-Z scan 212. A range for the offset is 5 to 15 mm, preferably 8 to 12 mm. Further uniformity is achieved by an equal displacement in the opposite direction from the baseline scan 210 for performance of a third double-Z scan 214. Thereafter, the scan pattern may return to the baseline scan 210. Further offset values may be used. The various parts of the complete scan may be performed for deposition onto one substrate or onto multiple, sequentially inserted substrates. One complete double-Z scan is advantageously performed in sputter depositing on one substrate and a subsequent displaced double-Z scan is performed on a subsequent substrate.

Figure 18:
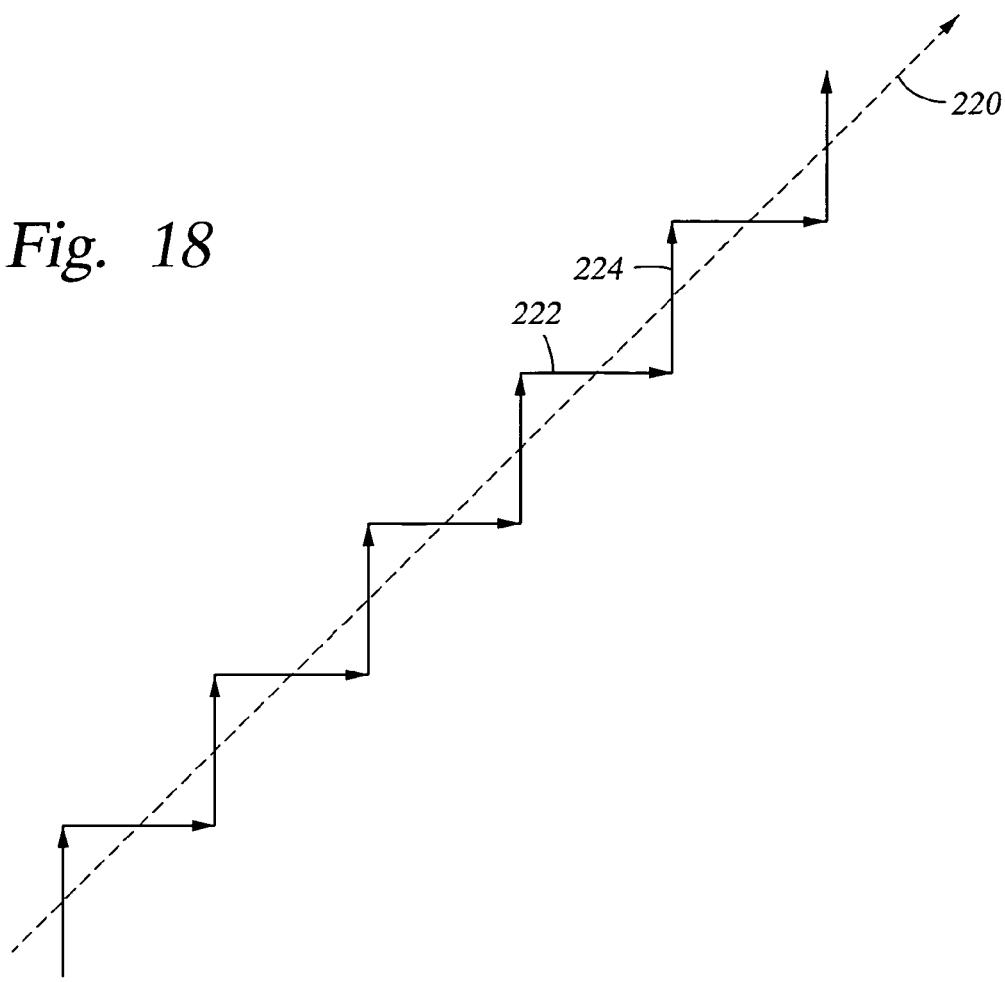
FIG. 18 is a map of a zig-zag diagonal scan path.

It is possible to simultaneously activate two perpendicularly arranged actuators to cause the magnetron to move along a diagonal path 220 illustrated in FIG. 18. However, in some situations it is instead preferred to follow a zig-zag path consisting of alternating small movements 222 along one Cartesian coordinate with small movements 224 along the other, perpendicularly arranged Cartesian coordinate. For example, each movement 222, 224 may be about 1 mm. A range of lengths of the movements 222, 224 is 0.4 to 3 mm, preferably 0.8 to 1.2 mm. If the diagonal path 220 is not arranged at 45° with respect to the cartesian coordinates, the movements 222, 224 may have different lengths between them. If it is difficult to provide the precise ratio of perpendicular movements, for example, with a stepper motor, then different movements in the same direction may have different lengths that on average produce a path in the desired direction. This alternating movement achieves a larger effective scan area to increase the sputtering uniformity. It is further advantageous with the perpendicularly arranged actuators of FIG. 15, which do not include a rolling mechanism against the magnetron plate. In this situation simultaneous movement in perpendicular directions cause at least one of the rod contacts to slide against the magnetron plate or the bosses. In contrast, with the alternating movement, the actuator not being used can be backed away from the magnetron plate so as to not contact the magnetron plate as it moves laterally past.

Experiments have demonstrated that rectangular targets can be substantially uniformly over a central area extending to within 150 mm of the frame. Uniformity in one direction can be extended by increasing the length of the straight portions of the serpentine magnetron while uniformity in the other direction is increased by the magnetron scanning.

Figure 19:
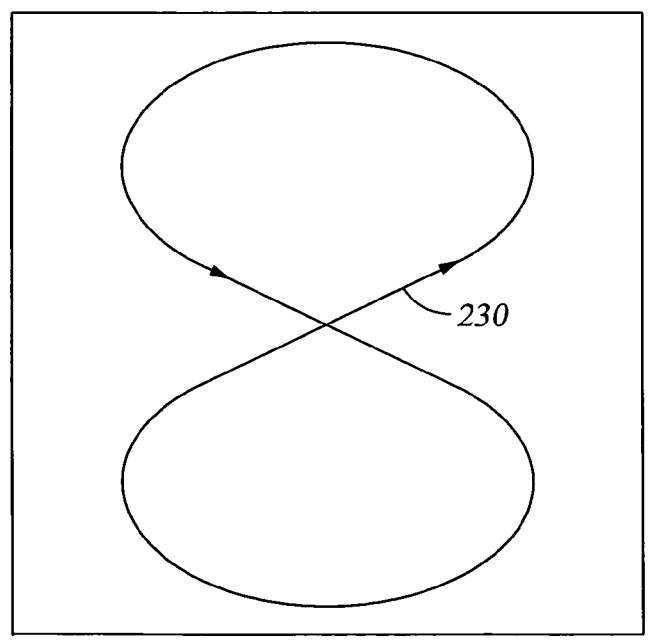
FIG. 19 is a map of a figure-8 scan as an example of a two-dimensional curved scan path.

The full set of actuators allow more complex, nearly arbitrary scan patterns, possibly including curved portions. For example, a figures-8 scan 230 shown in FIG. 19 can be achieved by continuously varying the control of the four sets of actuators.

Many of the advantages of the invention can be achieved if two-dimensional scanning or delayed plasma ignition is applied to a convention magnetron composed of a plurality of parallel but independent linear magnetrons 24 of FIG. 2 formed with plural parallel inner poles 26 all surrounded by a single outer pole 32 with multiple parallel openings for the inner poles 26 and the respective plasma loops. However, the convolute single plasma loops of the serpentine and helical magnetrons of the invention are believed to provide more efficient and controllable sputtering.

The different aspects of the invention provides more uniform target erosion and sputter deposition with very large rectangular sputter targets. The convolute magnetrons are achievable with little increased cost. The two-dimensional scanning requires additional complexity in the scan mechanism, but the slow scanning reduces its bulk.

The invention claimed is:

1. In a plasma sputter reactor fittable with a rectangular target for sputter depositing material of said target onto a rectangular substrate and a magnetron disposable on a back side of said target opposite said substrate, a scan mechanism scanning said magnetron in a double-Z pattern extending along two opposed sides of a rectangle aligned with said target and along two connecting diagonals of said two opposed sides.

2. The scan mechanism of claim 1, wherein said magnetron has multiple separated magnetic portions extending along one of two orthogonal directions of the rectangular target.

3. The scan mechanism of claim 1, wherein said magnetron includes an inner pole surrounded by an outer pole in a convolute pattern.

4. In a plasma sputter reactor fittable with a rectangular target for sputter depositing onto a rectangular substrate, a magnetron system comprising:
   a magnetron having multiple separated magnetic portions extending in straight sections along a first direction; and
   scanning means for scanning said magnetron in a double-Z pattern extending along two opposed sides of a rectangle aligned with said target and along two connecting diagonals of said two opposed sides.

5. The magnetron system of claim 4, wherein said magnetron forms a plasma loop having a convolute shape.

6. The magnetron system of claim 5, wherein said convolute shape is a serpentine shape.

7. The magnetron system of claim 5, wherein said convolute shape is a rectangularized spiral shape.

8. The magnetron system of claim 5, wherein magnetron comprises:
   an inner pole having a first magnetic polarity formed in said convolute shape; and
   an outer pole having a second magnetic polarity opposite said first magnetic polarity and separated from said inner pole by a gap.

9. The magnetron system of claim 4, wherein said scanning means includes two independent actuators applying force to said magnetron along two respective directions non-parallel to one another.

10. A method of sputtering onto a stationary rectangular substrate, comprising the steps of:
   scanning on a backside of a rectangular target opposite said substrate, a generally rectangular magnetron producing a closed plasma loop, the scanning performed in a double-Z pattern extending along two opposed sides of a rectangle aligned with said target and along two connecting diagonals of said opposed sides.

11. The method of claim 10, wherein said plasma loop is formed in a convolute shape.

12. The method of claim 10, wherein said scanning is performed at a rate of between 0.5 to 5 mm/s.

13. The method of claim 10, wherein said scanning is performed in a plurality of said double-Z patterns offset from each other.

14. The method of claim 10, wherein said magnetron comprises:
- an inner pole having a first magnetic polarity and extending along a path having a convolute shape; and
- an outer pole having a second magnetic polarity opposite said first magnetic polarity and surrounding said inner pole.

15. The method of claim 14, wherein said inner pole includes a plurality of disjoint straight portions.

16. The method of claim 10, wherein said magnetron has sides with lengths at least 80% the lengths of corresponding sides of said target.

17. A method of sputtering onto a stationary rectangular substrate, comprising the step of:
- scanning a magnetron in back of a rectangular sputtering target in a double-Z pattern along two opposed sides of a rectangle aligned with said target and along diagonals connecting ends of said two opposed sides.

18. The method of claim 17, wherein said magnetron is substantially rectangular and forms a closed plasma loop having a convolute shape.

19. The method of claim 17, wherein said magnetron is scanned at a rate in a range of between 0.5 and 5 mm/s.

20. The method of claim 17, wherein said magnetron is scanned in a plurality of said double-Z patterns offset from each other.

21. A method of sputtering onto a rectangular substrate, comprising the steps of:
- scanning a magnetron in back of a rectangular sputtering target in a double-Z pattern extending along two opposed sides of a rectangle aligned with said target and along two connecting diagonals of said two opposed sides;
- igniting a plasma adjacent said target at a predetermined distance from said first position in a direction toward said second position and maintaining said plasma thereafter.

22. The method of claim 21, wherein said predetermined distance is between 1 and 5 mm.

23. The method of claim 21, wherein said magnetron has a convolute shape having multiple disjoint straight portions.

24. A flat panel sputter reactor, comprising:
- a vacuum chamber sealed to a sputtering target;
- an electrical source connected to the vacuum chamber to excited a gas with the vacuum chamber into a plasma to sputter material from the sputtering target;
- a pedestal configured to support a generally rectangular flat panel in opposition to the target;
- a magnetron positioned on a side of the sputtering target opposite the pedestal to produce magnetic fields on a side of the target facing the pedestal; and
- a scan mechanism capable of scanning the magnetron in a double-Z pattern extending along two opposed sides of a rectangle aligned with said target and along two connecting diagonals of said two opposed sides.

25. The reactor of claim 24, wherein the magnetron has sides with lengths at least 80% the lengths of corresponding sides of the target.

26. The reactor of claim 24, wherein the scan mechanism can scan the magnetron in perpendicular directions parallel to two perpendicular sides of the target.

27. The reactor of claim 24, wherein the scan mechanism includes at least two independent actuators applying force to the magnetron along two respective directions non-parallel to one another.

28. The reactor of claim 24, wherein the magnetron comprises:
- an inner pole having a first magnetic polarity perpendicular to a plane and including a plurality of straight portions at least some of which extend along one rectangular coordinate in a convolute pattern; and
- an outer pole having a second magnetic polarity opposite the first magnetic polarity, surrounding the inner pole, and separated therefrom by a separation forming a closed loop.

29. The reactor of claim 28, wherein the convolute pattern is serpentine.

30. The reactor of claim 28, wherein the convolute pattern is a rectangularized spiral.

* * * * *

UNITED STATES PATENT AND TRADEMARK OFFICE
CERTIFICATE OF CORRECTION

PATENT NO. : 7,513,982 B2
APPLICATION NO. : 10/863152
DATED : April 7, 2009
INVENTOR(S) : Avi Tepman It is certified that error appears in the above-identified patent and that said Letters Patent is hereby corrected as shown below:

Column 5, Line 47, please delete the first "98" and insert --96-- therefor;

Column 8, Line 65, please delete "128" and insert --130-- therefor;

Column 13, Claim 21, Line 38, please delete "from" and insert --form-- therefor.

Signed and Sealed this

Twenty-third Day of June, 2009

JOHN DOLL
*Acting Director of the United States Patent and Trademark Office*